United States Patent [19]

West

[11] Patent Number: 4,849,659

[45] Date of Patent: Jul. 18, 1989

[54] EMITTER-COUPLED LOGIC CIRCUIT WITH THREE-STATE CAPABILITY

[75] Inventor: Jeffery A. West, Pleasant Grove, Utah

[73] Assignee: North American Philips Corporation, Signetics Division, Sunnyvale, Calif.

[21] Appl. No.: 132,377

[22] Filed: Dec. 15, 1987

[51] Int. Cl.[4] .......................................... H03K 19/086
[52] U.S. Cl. .................................... 307/455; 307/443; 307/473; 307/475
[58] Field of Search ............... 307/443, 455, 473, 475, 307/494, 557, 558, 567

[56] References Cited

U.S. PATENT DOCUMENTS

| Re. 29,982 | 5/1979 | Aoki | 307/243 X |
| 3,630,990 | 1/1987 | Buscaglia et al. | 307/455 X |
| 3,758,791 | 9/1973 | Taniguchi et al. | 307/455 X |
| 4,490,630 | 12/1984 | Freeman | 307/455 |
| 4,682,058 | 7/1987 | Gal | 307/473 |
| 4,751,406 | 6/1988 | Wilson | 307/455 |

FOREIGN PATENT DOCUMENTS 2128432A 4/1984 United Kingdom .

OTHER PUBLICATIONS

Gustafson et al, "ECL Enhances Proven Parallel Architecture," *Northcon*/85, 22–24, Oct. 1985, pp. 1–13.
*Signetics ECL 10 K/100 K Data Manual* 1986, Signetics Corp., Mar. 1986, pp. 4-3-4-5, 4-12, 6-227, 6-228, 7-58, and 7-59.

*Primary Examiner*—David Hudspeth
*Attorney, Agent, or Firm*—R. Meetin; D. Treacy; T. Briody

[57] ABSTRACT

An ECL circuit ($30_1$) formed with a pair of emmitter-coupled bipolar transistors ($Q1_A$ and $Q1_B$), a main current source (26), a resistor ($R1_A$), and an output transistor (Q2) contains a switching stage (38) for placing the circuit in the three-state mode when the circuit is operated in the normal ECL output voltage range. The switching stage causes current exceeding that supplied by the current source to flow through the resistor. The output transistor turns off, enabling the circuit to exhibit high output impedance.

18 Claims, 3 Drawing Sheets

EMITTER-COUPLED LOGIC CIRCUIT WITH THREE-STATE CAPABILITY

FIELD OF USE

This invention relates generally to electronic circuits using emitter-coupled logic (ECL) and, in particular, to an ECL circuit capable of operating in the three-state mode.

BACKGROUND ART

The term "three-state" as used to describe a digital circuit that drives further circuitry refers to a specific operational mode in which the digital circuit is electronically disconnected from the further circuitry without being physically disconnected from it. More precisely, the digital circuit has an output terminal from which information is supplied to an input point of the further circuitry. While continuing to accept and process input data, the digital circuit can be switched from (a) a condition in which the output terminal exhibits low impedance to the further circuitry as the digital circuit switches between a pair of binary logic states to (b) a condition in which the output terminal exhibits very high impedance to the further circuitry. The latter condition is the third state. Due to the high output impedance, the input point of the further circuitry is effectively disconnected from the output terminal.

Three-state is highly advantageous when the further circuitry is driven by a number of digital circuits, only one of which provides information intended to drive the further circuitry at any given time. By placing the other circuits in the three-state mode, they do not load the further circuitry. This allows it to operate more efficiently. Use of three-state also avoids undesirable interactions among the digital circuits by way of the further circuitry.

A better understanding of three-state is facilitated with the assistance of FIG. 1 which illustrates how it is typically used when transistor-transistor logic (TTL). FIG. 1 shows a prior art system containing M three-state logic circuits $10_1$–$10_M$, of which at least circuit $10_1$ is a TTL gate. Circuits $10_1$–$10_M$ provide a one-bit data bus 12 with digital information in response to digital input singals $V_{I1}$-$V_{IM}$ and output enabling signals $V_{OE1}$-$V_{OEM}$. Data bus 12 is terminated by resistors $R_{TC}$ and $R_{TE}$ to respective sources of high and low supply voltages $V_{CC}$ and $V_{EE}$.

The $V_{OE}$ signals for all but one of circuits $10_1$–$10_M$ are normally at output disabling values that place those M-1 circuits in the three-state mode to electrically disconnect their output terminals from bus 12. The $V_{OE}$ signal for the remaining one of circuits $10_1$–$10_M$ is at an output enabling value. This enables bus 12 to accept its output signal.

Turning specifically to circuit $10_1$, it consists of (a) a TTL input stage 14, (b) a TTL output stage 16 formed with NPN transistors QA, QB, QC, and QD and resistors RA, RB, RC, and RD, and (c) a three-state switching stage 18 formed with a control circuit 20 and NPN transistor QE. Gate $10_1$ provides its output signal at an output terminal $T_O$ connected to bus 12. When signal $V_{OE1}$ is at the output enabling value, control 20 maintans transistor QE in the off condition to prevent it from affecting output stage 16. Depending on the value of signal $V_{I1}$, one of output transistors QC and QD is on while the other is off. This defines two logic states. In both cases, current flows through terminal $T_O$, so that it exhibits low output impedance.

Control 20 turns transistor QE on when signal $V_{OE1}$ is switched to the output disabling value. This causes transistors QA and QB to turn off regardless of their prior conductive conditions which, in turn, similarly causes both of output transistors QC and QD to turn off. Circuit $10_1$ goes into the three-state mode. Substantially no current flows through terminal $T_O$. It now presents a very high output impedance. The presence of two serially connected output transistors (i.e., devices QC and QD) makes TTL very conducive to three-state.

The situation is quite different with ECL. For example, consider FIG. 2a which illustrates how a conventional ECL output stage 22 interfaces with a one-bit data bus 24. Supply voltages $V_{CC}$ and $V_{EE}$ which provide power to output stage 22 are typically 0 volt and around −5 volts in ECL.

Stage 22 centers around main NPN transistors $Q1_A$ and $Q1_B$ whose bases respectively receive base input signals $V_A$ and $V_B$. The emitters of transistors $Q1_A$ and $Q1_B$ are connected together at node N1 in a differential configuration. Their collectors are respectively coupled through small equal-size load resistors $R1_A$ and $R1_B$ to the $V_{CC}$ supply. A main current source 26 connected between node N1 and the $V_{EE}$ supply provides a main supply current $I_M$ for transistors $Q1_A$ and $Q1_B$. An intermediate voltage signal $V_{ITM}$ representative of the state of stage 22 is taken from a node N2 at the $Q1_A$ collector.

Intermediate signal $V_{ITM}$ is supplied to the base of an NPN output transistor Q2 whose collector is tied to the $V_{CC}$ supply. Transistor Q2 is always on during circuit operation. Stage 22 provides its output signal to bus 24 by way of terminal $T_O$ connected to the Q2 emitter. The signal voltage on bus 24 is thus about $1V_{BE}$ less than $V_{ITM}$. $V_{BE}$ is the standard voltage of 0.7–0.8 volt that exists across the base-emitter junction of a bipolar transistor when it just reaches full conduction in the forward direction. Bus 24 is terminated by a resistor $R_T$ to a source of a termination voltage $V_{TT}$ which is usually about 2 volts below $V_{CC}$.

Stage 22 is at a high binary state (or logical "1") when transistor $Q1_A$ is off and transistor $Q1_B$ is on. This usually arises when the voltage difference $V_B$—$V_A$ is about 100 millivolts. None of supply current $I_M$ flows through resistor $R1_A$. The only current flowing through resistor $R1_A$ is the small current needed to drive the Q2 base. As a result, voltage $V_{ITM}$ is at a high level near $V_{CC}$. Because transistor Q2 is on, current flows through terminal $T_O$ causing it to exhibit a low impedance to bus 24.

Stage 22 goes into a low binary state (or logical "0") when $V_B$—$V_A$ is reversed so as to turn transistor $Q1_A$ on and turn transistor $Q1_B$ off. All of current $I_M$ flows through resistor $R1_A$. Voltage $V_{ITM}$ drops to a low level approxaimtely equal to $V_{CC}-I_M R_1$, where $R_1$ is the resistance of resistor $R1_A$ or $R1_B$. The voltage swing $I_M R_1$ is typically in the neighborhood of $1V_{BE}$. Terminal $T_O$ again exhibits a low impedance to bus 24. Stage 22 thus switches between two binary logic states, both at low output impedance.

Applying three-state to ECL is a tough problem, largely because there is only one output transistor rather than two as in TTL. Gustafson et al, "ECL Enhances Proven Parallel Architecture," *Northcon/85*, 22–24 Oct. 1985, pp. 1–13, discusses some of the difficulties that arise in trying to solve the problem. As a solution, Gustafson et al describe a system in which a "wired-OR" arrangement is combined with bus drivers that provide high output impedance when they are in the low logic state. This system is relatively complex and does not appear particularly efficient or fast. Moreover, it does not truly use three-state.

The Signetics 100123 ECL integrated circuit is a bus driver of the type employed in Gustafson et al. With reference to FIG. 2a, voltage swing $I_M R_1$ is raised to double its normal value in output stage 22 of the Signetics 100123. This enables transister Q2 to turn off when stage 22 is in the low (but not the high) logic state. Terminal $T_O$ presents a high impedance to bus 24 during that time. Even though the Signetics 100123 still operates in only two different states, it does achieve some of the advantages of three-state. However, the increased voltage and the charging/discharging of the Q2 base during normal switching cause the Signetics 100123 to operate significantly slower than an otherwise comparable ECL device.

In explanation of how wired-OR is used in ECL, FIG. 2b illustrates an ECL output stage 28 having a wired-OR capability. Stage 28 is the same as state 22 depicted in FIG. 2a except that an NPN transistor $Q1_C$ is connected between node N1 and the $Q1_B$ collector. A control voltage $V_C$ is supplied to the $Q1_C$ base.

Transistor $Q1_C$ turns on when $V_C$ is raised to a suitable high value. All of current $I_M$ flows through resistor $R1_B$. $V_{ITM}$ thereby goes to its high level irrespective of the values of $V_A$ and $V_B$. Alternatively, the $Q1_B$ collector could be connected to the $Q1_A$ collector. $V_{ITM}$ would then go unilaterally to its low level. The wired-OR arrangement comes close to three-state in the sense that stage 28 can be placed at either a high logic state or a low logic state regardless of the values of $V_A$ and $B_B$. However, wired-OR does not provide a true three-state capability in which there are two binary states at low output impedance and one state at high output impedance.

ECL operates much faster than TTL. Accordingly, it would be highly desirable to have an ECL circuit that can be operated in the three-state mode over the normal ECL output voltage range extending from $V_{CC}-2$ volts to $V_{CC}$.

GENERAL DISCLOSURE OF THE INVENTION

The present invention is logic circuit that provides such a capability.

The core of this circuit consists of first and second like-polarity bipolar transistors arranged in a differential configuration. The first transistor has a base that receives an input voltage, an emitter coupled to a first node, and a collector coupled to a second node at which an intermediate voltage signal representative of the state of the circuit is provided. The second transistor has a base that receives another input voltage, an emitter coupled to the first node, and a collector coupled to a source of a first supply voltage. A current source coupled between the first node and a source of a second supply voltage provides a main supply current at the first node. A resistor is coupled between the second node and the source of the first supply voltage.

The intermediate signal is at a firt voltage level representing a first logic state when the first transistor is off and the second transistor is on so that largely none of the main supply current flows through the resistor. The intermediate signal is at a second voltage level representing a second logic state when the first transistor is on and the second transistor is off so that largely all of the main supply current flows through the resistor. The second voltage level is closer to the second supply voltage than the first voltage level.

The circuit contains a like-polarity bipolar output transistor having a base coupled to the second node, an emitter coupled to an output terminal, and a collector coupled to a voltage source. The output transistor is turned on when the the intermediate signal is at the first or second voltage level. The output terminal thereby exhibits low impedance to further circuitry driven from the output terminal.

A switching stage controls the intermediate signal in response to an output control signal. When the control signal is at a speciied condition, switching stage causes current exceeding the main supply current to flow through the resistor irrespective of the conductive conditions of the first and second transistors. Consequently, the intermediate signal reaches a voltage closer to the second supply voltage than the second level. This places the circuit in a third state.

An important function is performed by the further circuitry. It prevents the voltage at the output terminal from getting any closer to the second supply voltage than a termination voltage that lies between the supply voltages. The termination voltage is sufficiently close to the first supply voltage that the output transistor turns off when the control signal reaches the specified condition. The output terminal then exhibits very high impedance to the further circuitry, effectively disconnecting it from the logic circuit. In this way, the present ECL circuit achieves a true three-state capability over the portion of the supply voltage range extending between the first supply voltage and the termination voltage.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 1:
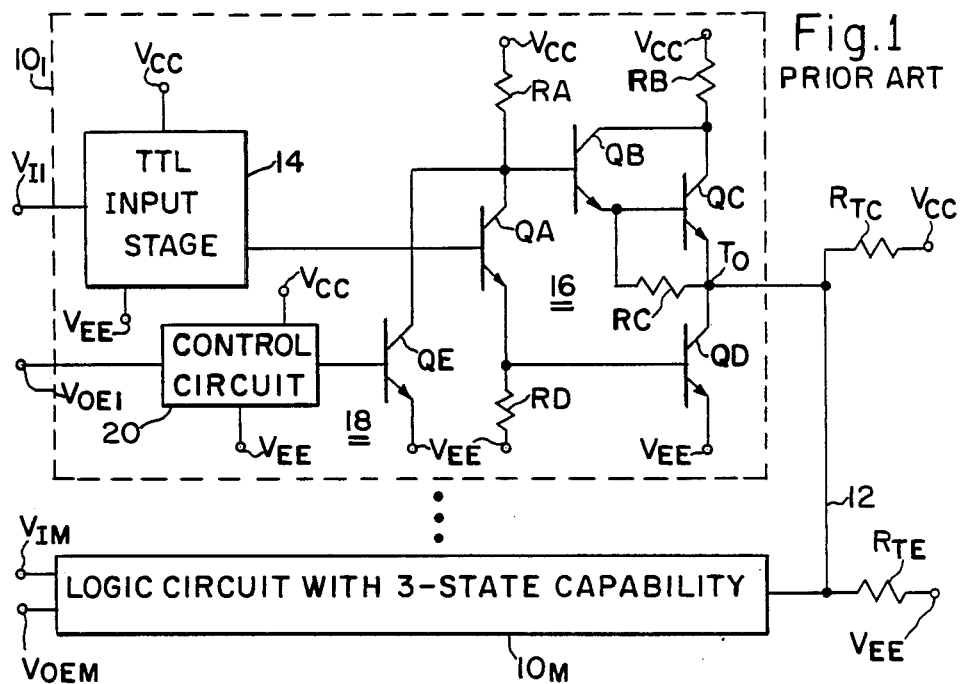
FIG. 1 is a circuit/block diagram of a prior art bus system containing at least one TTL circuit that operates in the three-state mode.
Figure 3:
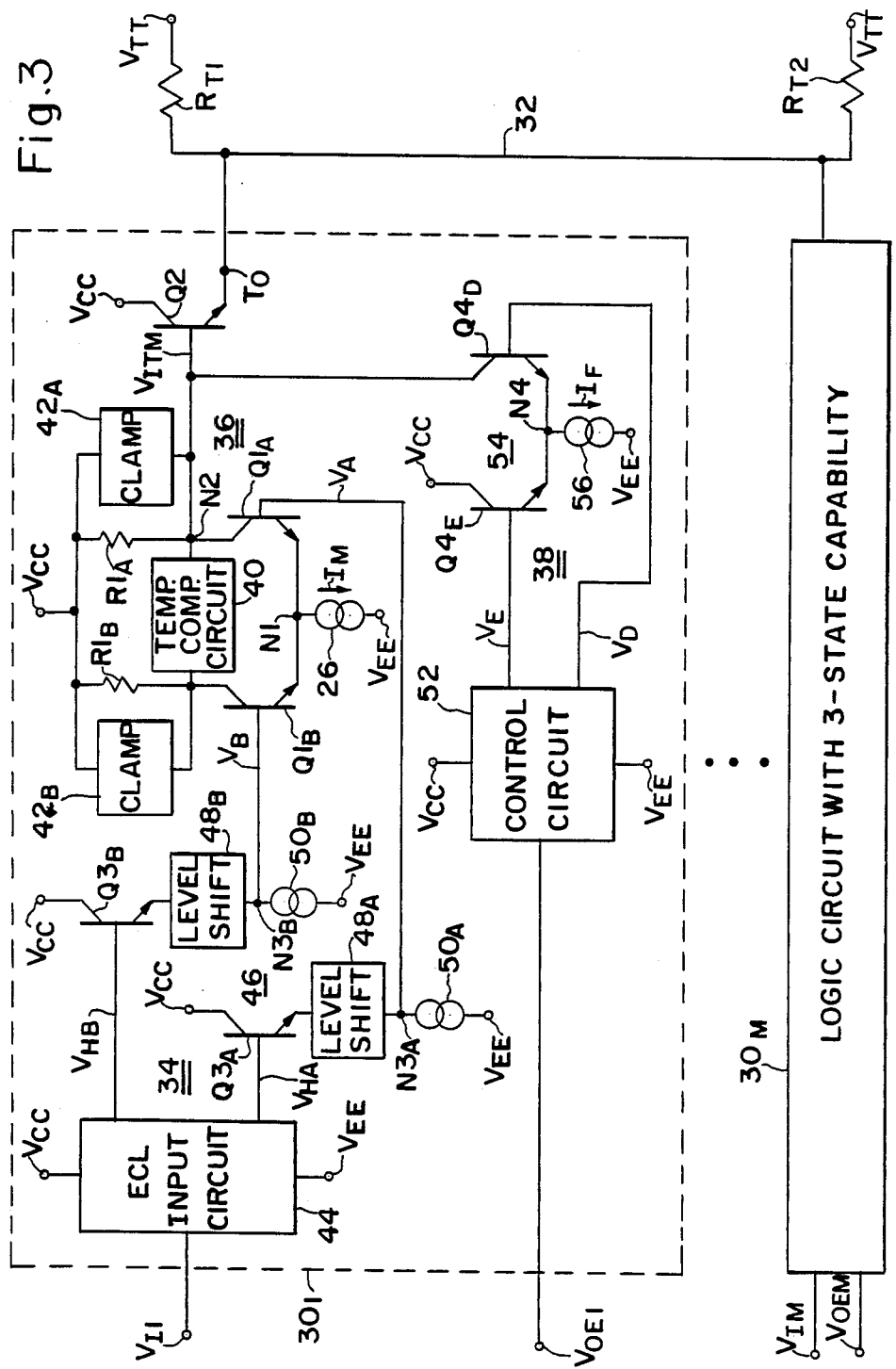
FIG. 3 is a circuit/block diagram of a bus system containing at least one ECL circuit capable of operating in the three-state mode in accordance with the invention.

Referring to FIG. 3, it illustrates an example of a system capable of achieving three-state with ECL. This system is formed with M three-state logic circuits $30_1$–$30_M$, of which at least circuit $30_1$ is an ECL gate. Circuits $30_1$–$30_M$ operate as a group in response to digital input signals $V_{I1}$–$V_{IM}$ and output enabling signals $V_{OE1}$–$V_{OEM}$ to control the information transmitted on a one-bit data bus 32 in the same way that circuits $10_1$–$10_M$ in FIG. 1 control the data transmitted on bus 12.

Figure 2A:
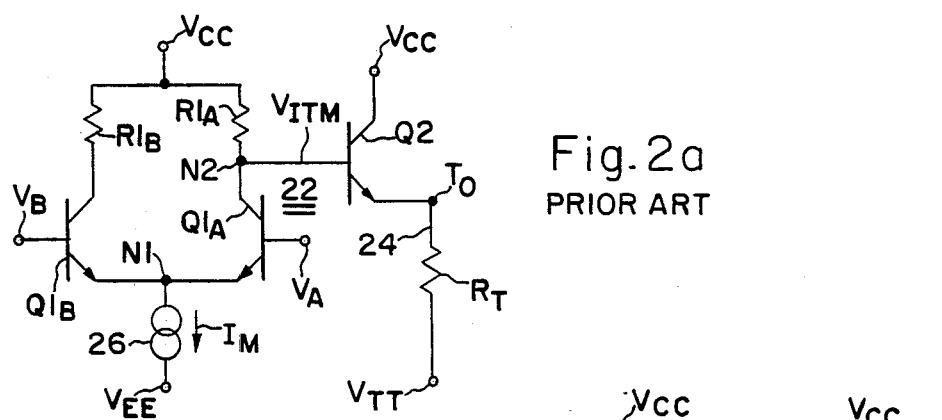
FIGS. 2a and 2b are circuit diagrams of prior art ECL output stages.
Figure 2B:
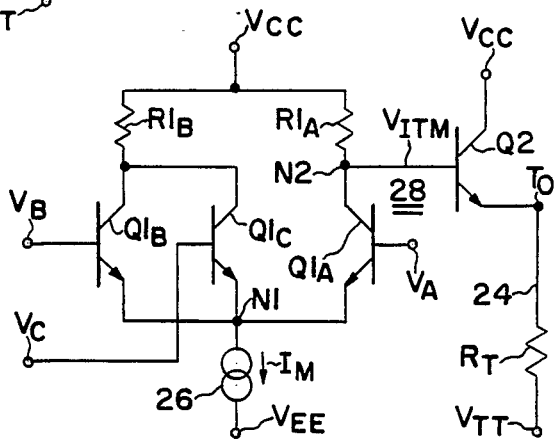

Bus 32 is preferably terminated at both ends through equal-value resistors $R_{T1}$ and $R_{T2}$ to the $V_{TT}$ termination supply. Alternatively, bus 32 could be arranged as shown in FIG. 2a or 2b for bus 24. In either case, termination voltage $V_{TT}$ lies between supply voltages $V_{CC}$ and $V_{EE}$.

ECL circuit $30_1$ consists of an input stage 34, an output stage 36, and a three-state switching stage 38. Output stage 36 is a good starting point for examining the configuration and operation of gate $30_1$.

Output stage 36 is a differential amplifier containing main NPN transistors $Q1_A$ and $Q1_B$, load resistors $R1_A$ and $R1_B$, current source 26, and NPN output transistor Q2 all arranged as in FIG. 2a. Resistor $R1_A$ is essential to the circuit design because the voltages defining the states of circuit $30_1$ are produced across it. For transistor Q2 to be fully conductive when signal $V_{OE1}$ is at the output enabling value, $V_{CC}-V_{TT}-V_{BE}$ must be greater than the voltage swing $I_M R_1$ across resistor $R1_A$. In contrast, resistor $R1_B$ is employed basically to provide "balancing" for a temperature compensation circuit 40 connected between the $Q1_A$ and $Q1_B$ collectors. Compensation circuit 40 stabilizes the circuit output signal against temperature variations.

A voltage clamp $42_A$ is connected between the $V_{CC}$ supply and the $Q1_A$ collector (or node N2). Clamp $42_A$ prevents the voltage across resistor $R1_A$ from exceeding a clamped value $V_{CL}$. For reasons dealt with below, $V_{CL}$ is greater than $V_{CC}-V_{TT}-V_{BE}$. Another voltage clamp $42_B$ connected between the $V_{CC}$ supply and the $Q1_B$ collector prevents the voltage across resistor $R1_B$ from exceeding $V_{CL}$. Clamp $42_B$ rarely becomes active. It basically "balances" clamp $42_A$ to allow circuit 40 to operate efficiently.

When signal $V_{OE1}$ is at the output enabling value, stage 36 operates in the manner described above for stage 22 in FIG. 2a. Clamps $42_A$ and $42_B$ are inactive since $V_{CL}$ is greater than $I_M R_1$ (by virtue of the inequalities given in the two preceding paragraphs). When transistor $Q1_A$ is off and transistor $Q1_B$ is on so that largely none of supply current $I_M$ flows through resistor $R1_A$, intermediate voltage $V_{ITM}$ reaches a high level near $V_{CC}$ representing the high binary state. $V_{ITM}$ drops to a low value approximately equal to $V_{CC}-I_M R_1$ representing the low binary state when transistor $Q1_A$ is on and transistor $Q1_B$ is off so that largely none of current $I_M$ flows through resistor $R1_A$.

Transistor Q2 is turned on during the times that $V_{ITM}$ switches between $V_{CC}$ and $V_{CC}-I_M R_1$. Consequently, terminal $T_O$ exhibits low impedance to bus 32.

Moving back to input stage 34, it consists of an ECL input circuit 44 and a level-shifting circuit 46. In response to input signal $V_{I1}$, input circuit 44 generates complementary input voltages $V_{HA}$ and $V_{HB}$ that vary from a low value $V_{HMIN}$ lying between $V_{CC}$ and $V_{EE}$ to a high value near $V_{CC}$. $V_{HMIN}$ is usually about $1V_{BE}$ below $V_{CC}$. Level-shifting circuit 46 produces base input voltages $V_A$ and $V_B$ by respectively shifting voltages $V_{HA}$ and $V_{HB}$ downward by an amount equal to $1V_{BE}$ plus an additional level shift $V_{LS}$. Consequently, voltages $V_A$ and $V_B$ are complementary signals that vary from $V_{HMIN}-V_{BE}-V_{LS}$ approximately to $V_{CC}-V_{BE}-V_{LS}$.

Circuit 46 is divided into two identical sections. One of the sections is formed with an NPN level-shift transistor $Q3_A$ that provides a downshift equal to $1V_{BE}$, a level-shift element $48_A$ that provides a downshift equal to $V_{LS}$, and a current source $50_A$ connected between a node $N3_A$ and the $V_{EE}$ supply. The other section is similarly formed with an NPN level-shift transistor $Q3_B$ that provides a $1V_{BE}$ downshift, a level-shift element $48_B$ that provides a $V_{LS}$ downshift, and a current source $50_B$ connected between a node $N3_B$ and the $V_{EE}$ supply. Voltages $V_{HA}$ and $V_{HB}$ are respectively supplied to the bases of transistors $Q3_A$ and $Q3_B$ whose collectors are tied to the $V_{CC}$ supply. Level-shift elements $48_A$ and $48_B$ are respectively connected between the emitters of transistors $Q3_A$ and $Q3_B$ and nodes $N3_A$ and $N3_B$ from which voltages $V_A$ and $V_B$ are taken.

Level shifts $48_A$ and $48_B$ operate in conjunction with clamp $42_A$ to prevent transistor $Q1_A$ from going into deep saturation when signal $V_{OE1}$ is at the output disabling value—i.e., gate $30_1$ is in the three-state mode. This avoids a loss in response time that might otherwise occur when $V_{OE1}$ is switched to the output enabling value to remove circuit $30_1$ from the three-state mode.

In particular, $V_{LS}$ satisfies the relationship $$V_{LS} > V_{CL} - V_{BE} - V_{SV} \tag{1}$$

where $V_{SV}$ is the maximum tolerable forward voltage from the base of transistor $Q1_A$ to its collector. Since transistor $Q1_A$ goes into deep saturation when its base-to-collector voltage reaches $1V_{BE}$, $V_{SV}$ is somewhat less than $1V_{BE}$. $V_{SV}$ is usually no more than 0.5 volt and is preferably close to 0 volt. Good operation occurs when $V_{LS}$ equals $V_{CL}-V_{BE}$. Level shifts $48_A$ and $48_B$ similarly operate in combination with clamp $42_B$ to prevent transistor $Q1_B$ from going into deep saturation.

Switching circuit 38 consists of a control circuit 52 and a differential amplifier 54. Control circuit 52 produces complementary flow-control voltages $V_D$ and $D_E$ in response to signal $V_{OE1}$. Differential amplifier 54 is formed with flow transistors $Q4_D$ and $Q4_E$ and a current source 56 connected between the $V_{EE}$ supply and a node N4. Voltages $V_D$ and $V_E$ are respectively supplied to the control electrodes of transistors $Q4_D$ and $Q4_E$ which have first flow electrodes connected to node N4 to receive a further supply current $I_F$ from current source 56. Transistor $Q4_D$ has a second flow electrode connected to node N2. Transistor $Q4_E$ has a second flow electrode tied to the $V_{CC}$ supply.

Transistors $Q4_D$ and $Q4_E$ are preferably NPN transistors as indicated in FIG. 3. The first, second, and control electrodes of each transistor $Q4_D$ or $Q4_E$ are then respectively its emitter, collector, and base. Alternatively, transistors $Q4_D$ and $Q4_E$ might be N-channel field-effect transistors of the insulated-gate or junction type. In this case, the source, drain, and gate electrode are respectively the first, second, and control electrodes of each transistor $Q4_D$ or $Q4_E$.

Switching circuit 38 operates in the following way. When signal $V_{OE1}$ is at the output enabling value, control circuit 52 produces voltages $V_E$ and $V_D$ at respective high and low values. Transistor $Q4_E$ is turned on. Transistor $Q4_D$ is turned off to prevent circuit 38 from affecting the operation of output stage 36.

Control 52 reverses the values of $V_D$ and $V_E$ when $V_{OE1}$ is switched to the output disabling value. Transistor $Q4_E$ turns off. Transistor $Q4_D$ turns on and draws at least part of further supply current $I_F$ through resistor $R1_A$. The circuit parameters are chosen in such a way that current greater than main supply current $I_M$ flows through resistor $R1_A$ regardless of the conditions of transistors $Q1_A$ and $Q1_B$. Signal $V_{ITM}$ drops to a voltage below $V_{CC}-I_M R_1$. This places circuit $30_1$ in a third state.

For gate $30_1$ to be electrically disconnected from bus 32, transistor Q2 must turn off irrespective of the condition of bus 32 and irrespective of the conductive conditions of transistors $Q1_A$ and $Q1_B$. The "worst case" arises when transistor $Q1_A$ is off and the bus voltage equals $V_{TT}$. This is the situation in which the current that transistor $Q4_D$ draws through resistor $R1_A$ in order to force $V_{ITM}$ to a voltage low enough to turn off transistor Q2 is at its maximum value $I_{FR}$.

Clamp $42_A$ may be active or inactive in the "worst case". If clamp $42_A$ is active, it draws part of current $I_F$. Consequently, $I_F$ is greater than $I_{FR}$. If clamp $42_A$ is inactive, $I_F$ approximately equals $I_{FR}$.

Transistor Q2 turns off when its base-to-emitter voltage drops below $1V_{BE}$. $I_{FR}R_1$ must thus be greater than $V_{CC}-V_{TT}-V_{BE}$. Taking note of the above-mentioned relationship involving $V_{TT}$ and $I_M$, it follows that:

$$I_{FR}R_1 > V_{CC} - V_{TT} - V_{BE} > I_M R_1 \qquad (2)$$

By choosing $V_{TT}$ and $I_{FR}$ according to Eq. (2), transistor Q2 always turns off whenever $V_{OE1}$ is placed at the output disabling value. Circuit $30_1$ goes into a true three-state mode. Terminal $T_O$ exhibits very high impedance to bus 32.

If transistor $Q1_A$ is turned on when gate $30_1$ is in the three-state mode, clamp $42_A$ becomes active. This increases the circuit switching speed by preventing $V_{ITM}$ from going to a voltage much less than that needed to turn transistor Q2 off.

$V_{CL}$ is necessarily less than $(I_M + I_F)R_1$. Otherwise, clamp $42_A$ could not turn on. To turn transistor Q2 off, $V_{CL}$ must be greater than $V_{CC} - V_{TT} - V_{BE}$ (as mentioned above). As a result, $V_{CL}$ satisfies the relationship:

$$(I_M + I_F)R_1 > V_{CL} > V_{CC} - V_{TT} - V_{BE} > I_M R_1 \qquad (3)$$

$V_{CL}$ *is ideally equal to* $I_F R_1$. Clamp $42_A$ then becomes active when transistor $Q1_A$ is turned on but not when it is turned off. That is, $V_{ITM}$ reaches approximately the same voltage (when circuit $30_1$ is in the three-state mode) regardless of the conductive conditions of transistors $Q1_A$ and $Q1_B$. This provides the fastest overall switching speed.

Figure 4:
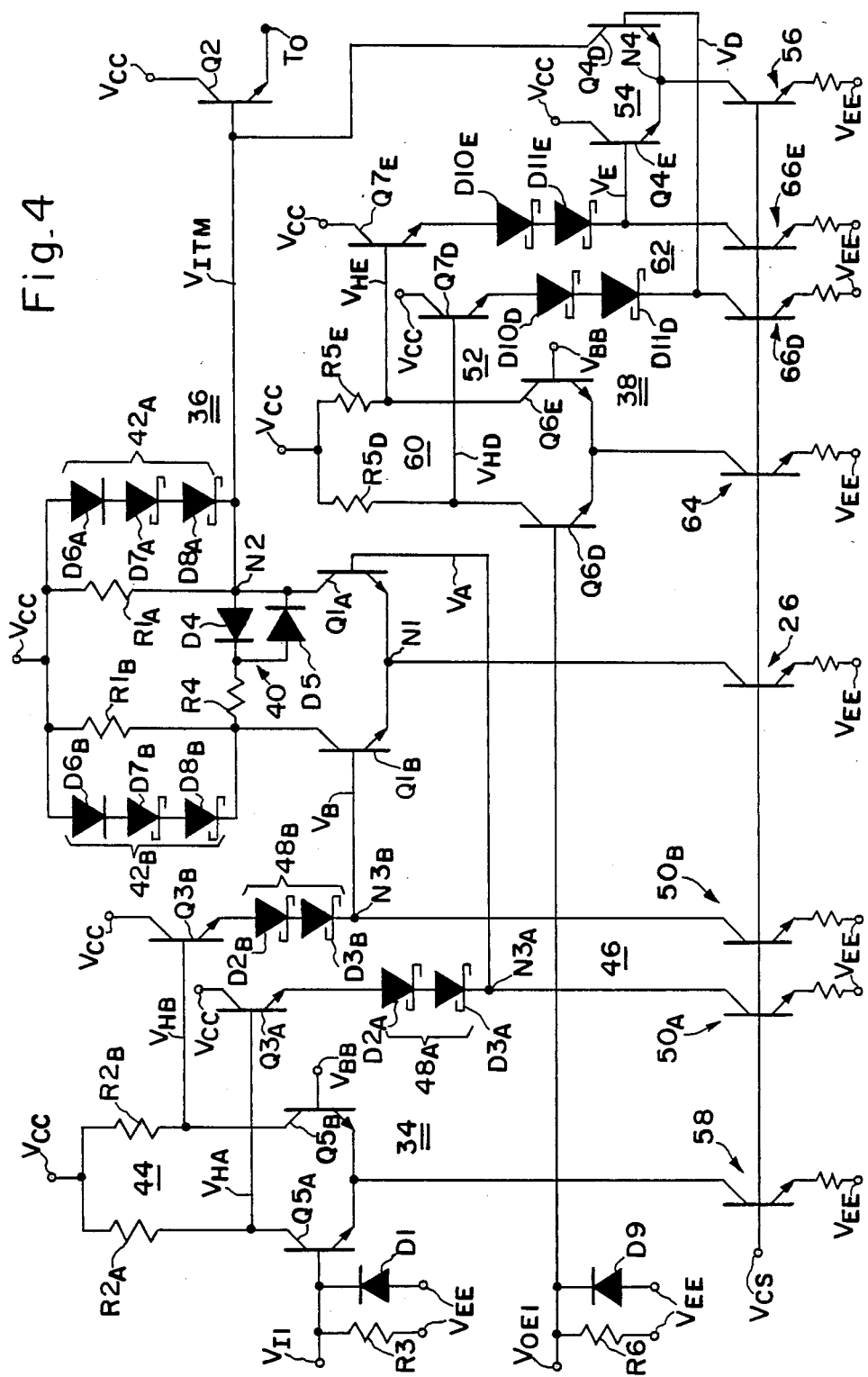
FIG. 4 is a circuit diagram illustrating further details of one ECL circuit in FIG. 3.

FIG. 4 shows details for a preferred embodiment of gate $30_1$. The operation of most of the specific circuitry shown in FIG. 4 should be evident to a person skilled in the ECL art, particularly in view of the foregoing discussion. Accordingly, only a brief description of FIG. 4 is given here.

Starting with input stage 34, input circuit 44 is a true-false buffer that produces voltages $V_{HB}$ and $V_{HA}$ respectively at the same and opposite logical values as the difference between voltage $V_{I1}$ and a reference voltage $V_{BB}$. The core of buffer 44 consists of NPN input transistors $Q5_A$ and $Q5_B$ arranged in a differential configuration, load resistors $R5_A$ and $R5_B$, and a current source 58. A resistor R3 and a PN diode D1 provide gate $30_1$ with protection from electrostatic discharge.

Level shift $48_A$ in level-shifting circuit 46 consists of Schottky diodes $D1_A$ and $D2_A$ arranged in series. Level shift $48_B$ similarly consists of Schottky diodes $D1_B$ and $D2_B$ in series. Diodes $D1_A$, $D2_A$, $D1_B$, and $D2_B$ are always on during circuit operation. $V_{LS}$ thereby equals $2V_{SH}$, where $V_{SH}$ is the standard voltage of approximately 0.4–0.5 volt that exists across Schottkey diode when it is fully conductive in the forward direction.

Moving to output stage 36, compensation circuit 40 is formed with a resistor R4 and PN diodes D4 and D5. Clamp $42_A$ consists of a PN diode $D6_A$ and Schottkey diodes $D7_A$ and $D8_A$. Clamp $42_B$ similarly consists of a PN diode $D6_B$ and Schottky diodes $D7_B$ and $D8_B$. $V_{CL}$ is equal to $V_{BE} + 2V_{SH}$ since the forward voltage across a fully conductive PN diode is $1V_{BE}$. In fact, each of diodes $D6_A$ and $D6_B$ is preferably implemented as an NPN transistor having its collector shorted to its base. $V_{LS}$ is therefore precisely equal to $V_{CL} - V_{BE}$ here.

Turning to switching circuit 38, control 52 consists of a true-false buffer 60 and a level-shifting circuit 62. Buffer 60 compared voltage $V_{OE1}$ with voltage $V_{BB}$ to generate complementary internal voltages $V_{HE}$ and $V_{HD}$ respectively at the same and opposite logical values as the difference $V_{OE1} - V_{BB}$. The core of buffer 60 consists of NPN input transistors $Q6_D$ and $Q6_E$ aranged in a differential configuration, load resistors $R5_D$ and $R5_E$, and a current source 64. A resistor R6 and a PN diode D9 provide electrostatic discharge protection.

Level-shifting circuit 62 is divided into two sections. One of the sections consists of an NPN level-shift transistor $Q7_D$, Schottky diodes $D10_D$ and $D11_D$, and a current source $66_D$ that generate $V_D$ by shifting $V_{HD}$ downward by an amount equal to $V_{BE} + 2V_{SH}$. The other section consists of an NPN level-shift transistor $Q7_E$, Schottky diodes $D10_E$ and $D11_E$, and a current source $66_E$ that generates $V_E$ by shifting $V_{HE}$ downward by the same amount. Circuit 62 is, in fact, identical to circuit 44.

Each of current sources 58, $50_A$, $50_B$, 26, 64, $66_D$, $66_E$, and 56 is formed with an NPN transistor and a resistor arranged in the conventional manner shown in FIG. 4. A common bias voltage $V_{CS}$ is supplied to the bases of these NPN transistors.

$V_{CC}$ and $V_{EE}$ are 0 volt (ground reference) and $-4.5$ volts, respectively, in the preferred embodiment of gate $30_1$. $V_{BB}$ and $V_{CS}$ are approximately $V_{CC} - 1.3$ volts and $V_{EE} + 1.3$ volts, respectively. $R_1$ is 310 ohms. Resistors $R2_A/R2_B$, R3, R4, $R5_D/R5_E$, and R6 are set at 250, 60,000, 400, 250, and 60,000 ohms, respectively. The resistors in current sources 58, $50_A/50_B$, 26, 64, $66_D/66_E$, and 56 are set at 500, 1,000, 150, 500, 250, and 75 ohms, respectively. $I_M$ and $I_F$ are 3 and 6 milliamperes, respectively. As a result, $V_{CL}$ is quite close to $I_F R_1$.

As to bus 32, each of resistors $R_{T1}$ and $R_{T2}$ is set at 50 ohms. $V_{TT}$ is $V_{CC} - 2.0$ volts. The composite system of FIGS. 3 and 4 thus operates over the normal ECL output voltage range.

While the invention has been described with reference to particular embodiments, this description is solely for the purpose of illustration and is not to be construed as limiting the scope of the invention claimed below. For example, semiconductor elements of opposite polarity to those described above may be used to achieve the same results. The clamps and level-shift elements can be formed with different numbers and types of diodes than those used in the preferred embodiment.

An intermediate signal complementary to signal $V_{ITM}$ could be provided from the $Q1_B$ collector to a further output transistor that drives a further one-bit data bus arranged the same as bus 32. A differential amplifier analogous to amplifier 54 could then be used to place the further output transistor in the three-state mode in response to signal $V_{OE1}$. Various applications, modifications, and changes may thus be made by those skilled in the art without departing from the true scope and spirit of the invention as described by the appended claims.

I claim:
1. A logic circuit comprising:

a first main bipolar transistor having a base that receives a base input voltage, an emitter coupled to a first node, and a collector coupled to a second node at which an intermediate voltage signal representative of the state of the circuit is provided;

a like-polarity second main bipolar transistor having a base that receives another base input voltage, an emitter coupled to the first node, and a collector coupled to a source of a first supply voltage;

a main current source, coupled between the first node and a source of a second supply voltage, for providing a main supply current at the first node;

a resistor coupled between the second node and the source of the first supply voltage, the intermediate signal being (1) at a first voltage level representing a first logic state when the first transistor is off and the second transistor is on so that largely none of the main supply current flows through the resistor and (2) at a second voltage level representing a second logic state when the first transistor is on and the second transistor is off so that largely all of the main supply current flows through the resistor, the second level being closer to the second supply voltage than the first level; and a like-polarity bipolar output transistor having a base coupled to the second node, an emitter coupled to an output terminal, and a collector coupled to a voltage source, the output transistor being on when the intermediate signal is at the first level or the second level so that the output terminal exhibits low impedance to further circuitry driven from the output terminal, the further circuitry preventing the voltage at the output terminal from getting any closer to the second supply voltage than a termination voltage lying between the supply voltages; characterized by switching means responsive to an output control signal when it is at a specified condition for causing current exceeding the main supply current to flow through the resisor irrespective of the conductive conditions of the main transistors, the intermediate signal thereby reaching a voltage closer to the second supply voltage than the second level so as to place the circuit in a third state, the voltage of the intermediate signal being sufficiently close to the termination voltage whenever the output control signal is at the specified condition that the output transistor turns off when the circuit is in the third state, whereby the output terminal exhibits high impedance to the further circuitry.

2. A circuit as in claim 1 wherein the further circuitry comprises a bus terminated on at least one end through a resistor to a source of the termination voltage, characterized in that the circuit and bus satisfy the relationship:

$$I_{FR}R_1 > V_{CC} - V_{TT} - V_{BE} > I_M R_1$$

where $I_{FR}$ is the magnitude of the maximum current that the switching means draws through the resistor when the first transistor is off, $R_1$ is the resistance of the resistor, $V_{CC} - V_{TT}$ is the magnitude of the difference between the first supply voltage and the termination voltage, $V_{BE}$ is the magnitude of the standard voltage across the base-emitter junction of a bipolar transistor when it just reaches full conduction in the forward direction, and $I_M$ is the magnitude of the main supply current.

3. A circuit as in claim 1 characterized that the switching means comprises:

a flow transistor having a first flow electrode coupled to a further node, a second flow electrode coupled to the second node, and a control electrode responsive to a flow-control voltage for controlling current transmission between the flow electrodes; and a further current source, coupled between the further node and the source of the second supply voltage, for providing a further supply current at the further node.

4. A circuit as in claim 3 characterized in that the switching means includes:

a further flow transistor having a first flow electrode coupled to the further node, a second flow electrode coupled to a voltage source, and a control electrode responsive to a further flow-control voltage for controlling current transmission between the flow electrodes of the further transistor; and control means responsive to the output control signal for generating both of the flow-control voltages.

5. A circuit as in claim 4 characterized in that each flow transistor is a like-polarity bipolar transistor having an emitter, a collector, and a base, which are respectively the first, second, and control electrodes of that transistor.

6. A circuit as in claim 5 characterized in that each transistor is an NPN transistor.

7. A circuit as in claim 5 characterized in that the control means comprises means for differentially comparing the control signal with a reference signal to produce the flow-control voltages.

8. A circuit as in claim 4 characterized by a voltage clamp coupled in parallel with the resistor between the second node and the source of the first supply voltage for limiting the voltage across the resistor.

9. A circuit as in claim 8 characterized in that the clamp prevents the magnitude of the voltage across the resistor from exceeding a value $V_{CL}$ that satisfies the relationship:

$$(I_M + I_F)R_1 > V_{CL} > V_{CC} - V_{TT} - V_{BE} > I_M R_1$$

where $I_M$ is the magnitude of the main supply current, $I_F$ is the magnitude of the further supply current, $R_1$ is the resistance of the resistor, $V_{CC} - V_{TT}$ is the magnitude of the difference between the first supply voltage and the termination voltage, and $V_{BE}$ is the magnitude of the voltage across the base-emitter junction of a bipolar transistor when it just reaches full conduction in the forward direction.

10. A circuit as in claim 9 characterized in that $V_{CL}$ is approximately $I_F R_1$.

11. A circuit as in claim 8 characterized by level-shifting means, responsive to a pair of complementary internal voltages that vary across a range extending from a voltage near the first supply voltage to a voltage between the supply voltages, for generating the base input voltages by respectively shifting the internal voltages towards the second supply voltage by largely equal amounts that exceed $1V_{BE}$, where $V_{BE}$ is the magnitude of the standard voltage across the base-emitter junction of a bipolar transistor when it just reaches full conduction in the forward direction.

12. A circuit as in claim 11 characterized in that the level-shifting means is divided into two sections, each comprising:

a like-polarity level-shift bipolar transistor having a base that receives a different one of the internal voltages, an emitter, and a collector coupled to a voltage source; and a level-shift element coupled between the emitter of the level-shift transistor and a node coupled to the base of a different one of the main transistors.

13. A circuit as in claim 12 characterized in that the level-shifting means and the voltage clamp prevent the first transistor from going into deep saturation.

14. A circuit as in claim 13 characterized in that: the clamp prevents the magnitude of the voltage across the resistor from exceeding a value $V_{CL}$ that satisfies the relationship:

$$(I_M+I_F)R_1 > V_{CL} > V_{CC}-V_{TT}-V_{BE} > I_M R_1$$

where $I_M$ is the magnitude of the main supply current, $I_F$ is the magnitude of the further supply current, $R_1$ is the resistance of the resistor, $V_{CC}-V_{TT}$ is the magnitude of the difference between the first supply voltage and the termination voltage, and $V_{BE}$ is the magnitude of the voltage across the base-emitter junction of a bipolar transistor when it just reaches full conduction in the forward direction; and each level-shift element produces a level-shift voltage having a magnitude $V_{LS}$ that satisfies the relationship $$V_{LS} > V_{CL}-V_{BE}-V_{SV}$$

where $V_{SV}$ is the magnitude of the maximum tolerable forward voltage between the base and collector of the first transistor.

15. A circuit as in claim 14 characterized in that $V_{LS}$ is approximately $V_{CL}-V_{BE}$.

16. A circuit as in claim 12 including a further resistor coupled between the collector of the second transistor and the source of the first supply voltage, characterized by a further voltage clamp coupled in parallel with the further resistor between the collector of the second transistor and the source of the first supply voltage for limiting the voltage across the further resistor.

17. A circuit as in claim 16 wherein the resistors have largely equal resistances, characterized in that: the clamps provide largely equal clamping levels; and the level-shift elements provide largely equal level shifts.

18. A circuit as in claim 17 characterized in that each of the clamps and level-shift elements comprises at least one diode.

* * * * *